United States Patent
Shibata

(10) Patent No.: US 6,593,652 B2
(45) Date of Patent: Jul. 15, 2003

(54) SEMICONDUCTOR DEVICE REINFORCED BY A HIGHLY ELASTIC MEMBER MADE OF A SYNTHETIC RESIN

(75) Inventor: Kazutaka Shibata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/092,542

(22) Filed: Mar. 8, 2002

(65) Prior Publication Data

US 2002/0125564 A1 Sep. 12, 2002

(30) Foreign Application Priority Data

Mar. 12, 2001 (JP) .......................................... 2001-68798

(51) Int. Cl.[7] .............................................. H01L 23/10
(52) U.S. Cl. ........................ 257/710; 257/709; 257/706
(58) Field of Search ................................ 257/706, 707, 257/709, 710, 729, 787

(56) References Cited

U.S. PATENT DOCUMENTS

| | | | | |
|---|---|---|---|---|
| 5,477,082 A | * | 12/1995 | Buckley, III et al. | |
| 5,866,943 A | * | 2/1999 | Mertol | |
| 5,909,056 A | * | 6/1999 | Mertol | |
| 5,909,057 A | * | 6/1999 | McCormick et al. | |
| 6,002,171 A | * | 12/1999 | Desai et al. | |
| 6,066,512 A | * | 5/2000 | Hashimoto et al. | |
| 6,097,085 A | * | 8/2000 | Ikemizu et al. | |
| 6,166,434 A | * | 12/2000 | Desai et al. | |
| 6,259,154 B1 | * | 7/2001 | Niwa | |
| 6,313,521 B1 | * | 11/2001 | Baba | |

* cited by examiner

Primary Examiner—Sheila V. Clark
(74) Attorney, Agent, or Firm—Rader, Fishman & Grauer PLLC

(57) ABSTRACT

A semiconductor device having: a wiring substrate; a semiconductor chip disposed thereon; and a heat radiating plate for radiating the heat generated from the semiconductor chip. A highly elastic member made of a synthetic resin is so disposed as to surround the semiconductor chip between the wiring substrate and the heat radiating plate.

4 Claims, 1 Drawing Sheet

SEMICONDUCTOR DEVICE REINFORCED BY A HIGHLY ELASTIC MEMBER MADE OF A SYNTHETIC RESIN

BACKGROUND OF THE INVENTION

1. Field of the Invention

The present invention relates to a semiconductor device comprising a semiconductor chip such as an IC chip.

2. Description of Related Art

Examples of a semiconductor device package structure include an FCBGA (Flip Chip Ball Grid Array) package structure. FIG. 2 shows an example of the arrangement of a semiconductor device having this FCBGA package structure.

More specifically, a semiconductor device of the FCBGA package type comprises a semiconductor chip 91, a wiring substrate 92 bonded thereto, a stiffener 93 so disposed as to surround the semiconductor chip 91 on the wiring substrate 92, and a heat radiating plate 94 laminated on the semiconductor chip 91 and the stiffener 93.

The semiconductor chip 91 is electrically and mechanically bonded to the surface 92a of the wiring substrate 92 through a plurality of bumps 95 formed on the active surface of the semiconductor chip 91. A plurality of soldering balls 96 serving as external connection terminals are disposed on the reverse face 92b of the wiring substrate 92 which is opposite to the surface 92a bonded to the semiconductor chip 91.

The stiffener 93 is a reinforcing member for keeping the flatness of the wiring substrate 92 and generally made of a metallic material. Accordingly, in manufacturing the semiconductor device having the arrangement above-mentioned, there should be executed steps, i.e., a step of gluing, through an adhesive layer 97, the stiffener 93 onto the surface of the wiring substrate 92 bonded to the semiconductor chip 91, and a step of gluing, through an adhesive layer 98, the stiffener 93 to the heat radiating plate 94. This complicates the manufacturing process, disadvantageously lowering the productivity.

SUMMARY OF THE INVENTION

It is an object of the present invention to provide a semiconductor device to be manufactured in a simple process.

According to the present invention, a semiconductor device comprises: a wiring substrate having a wiring pattern; a semiconductor chip disposed on the wiring substrate and electrically connected to the wiring pattern; a heat radiating plate disposed at the side of the semiconductor chip which is opposite to the side thereof facing the wiring substrate, this heat radiating plate being arranged for radiating the heat generated from the semiconductor chip; and a highly elastic member of a synthetic resin so disposed as to surround the semiconductor chip between the wiring substrate and the heat radiating plate.

According to the arrangement above-mentioned, the semiconductor chip is held by and between the wiring substrate and the metallic heat radiating plate, and the highly elastic member is disposed around the semiconductor chip. Accordingly, even though the thickness of the wiring substrate is small (e.g., not greater than 200 μm), the highly elastic member around the semiconductor chip can keep the flatness of the wiring substrate.

Further, the highly elastic member is made of a synthetic resin. Accordingly, the highly elastic member can be formed in a unitary structure with the wiring substrate in any of the following manners. For example, a wiring substrate bonded to a semiconductor chip is set to a mold, a liquefied synthetic resin material is then poured into the mold, and this synthetic resin material is then hardened. Alternatively, a plurality of wiring substrates bonded to semiconductor chips are arranged, a liquefied thermosetting resin material is then applied to the surrounding spaces around the semiconductor chips on the surface of the wiring substrates, and this thermosetting resin material is then hardened. Accordingly, as compared with a semiconductor device made by applying adhesives to a metallic stiffener and bonding the same to the wiring substrate, the semiconductor device of the present invention can be simplified in production process, resulting in improved productivity.

These and other features, objects, advantages and effects of the present invention will be more fully apparent from the following detailed description set forth below when taken in conjunction with the accompanying drawings.

DESCRIPTION OF THE PREFERRED EMBODIMENTS

Figure 1:
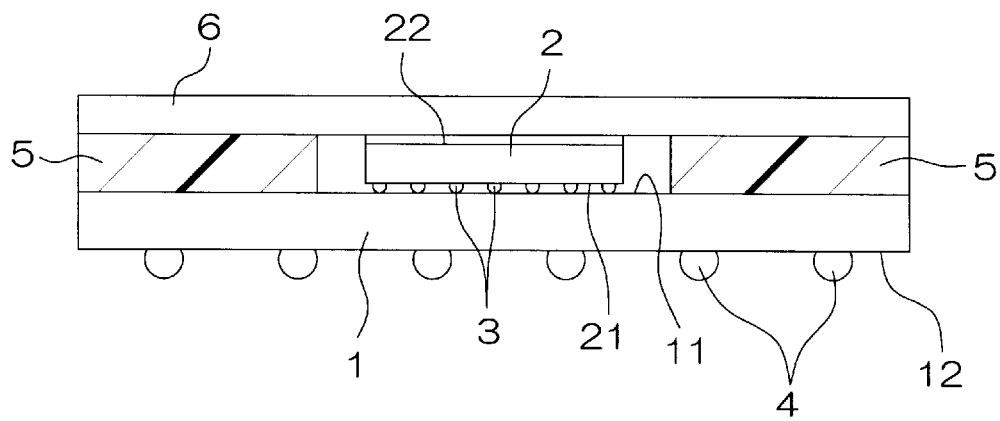
FIG. 1 is a section view schematically illustrating the arrangement of a semiconductor device according to an embodiment of the present invention.
Figure 2:
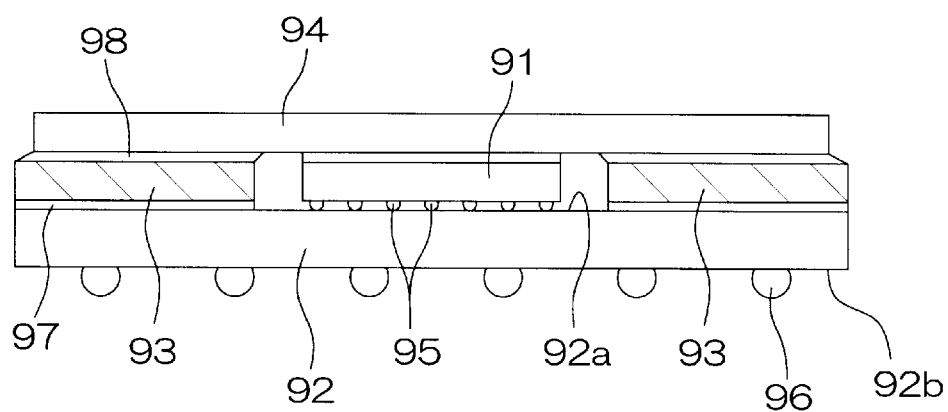
FIG. 2 is a section view schematically illustrating the arrangement of a semiconductor device of prior art.

FIG. 1 is a section view schematically illustrating the arrangement of a semiconductor device according to an embodiment of the present invention. This is a semiconductor device having a so-called FCBGA (Flip Chip Ball Grid Array) package structure, and comprises a thin wiring substrate 1 made into a thickness of about 50~about 200 μm with the use of a resin material such as a polyimide resin, a glass epoxy resin or the like. A wiring pattern is formed on the wiring substrate 1 by copper plating or the like.

A semiconductor chip 2 such as an IC chip or the like having for example a thickness of 300~400 μm is bonded in a face-down manner to a surface 11 of the wiring substrate 1. More specifically, the semiconductor chip 2 has an active surface 21 at the active surface layer side in which elements such as a transistor and the like are formed. With this active surface 21 faced to the substrate surface 11, the semiconductor chip 2 is bonded to the wiring substrate 1 through bumps 3 made of a conductive material such as gold or the like, and is electrically connected to the wiring pattern on the wiring substrate 1. As necessary, a protective resin for protecting the active surface 21 is poured into the gap between the surface 11 of the wiring substrate 1 and the active surface 21 of the semiconductor chip 2.

On the other hand, a plurality of soldering balls 4 serving as external connection terminals, are formed on the reverse face 12 of the wiring substrate 1 which is opposite to the surface 11 bonded to the semiconductor chip 2.

Disposed around the semiconductor chip 2 is a frame-like highly elastic member 5 made of a thermosetting resin material such as a thermosetting epoxy resin or the like.

The highly elastic member 5 is formed for example by setting, to a mold, the wiring substrate 1 with the semiconductor chip 2 bonded thereto, then pouring a liquefied thermosetting resin material into the mold, and then hardening the thermosetting resin material. Alternatively, such highly elastic members 5 may be formed by arranging a plurality of wiring substrates 1 with semiconductor chips 2 bonded thereto, then applying a liquefied thermosetting resin material to the surrounding spaces around the semiconductor chips 2 on the surfaces 11 of the wiring substrates 1, and then hardening this thermosetting resin material.

Preferably, the highly elastic member 5 is higher in elasticity than the wiring substrate 1. More specifically, the highly elastic member 5 preferably has elasticity equal to or higher than that of polyimide or glass epoxy.

A metallic heat radiating plate 6 for radiating the heat generated from the semiconductor chip 2, is glued to the non-active surface 22 of the semiconductor chip 2 which is opposite to the active surface 21. The metallic heat radiating plate 6 is so formed as to have sizes substantially equal to that of the wiring substrate 1 in plan. The highly elastic member 5 on the wiring substrate 1 is stuck fast to the surface of the metallic heat radiating plate 6 which faces the wiring substrate 1. More specifically, this semiconductor device has the arrangement that the semiconductor chip 2 is held by and between the wiring substrate 1 and the metallic heat radiating plate 6, and that the highly elastic member 5 is so disposed as to fill the surrounding spaces around the semiconductor chip 2.

Accordingly, even though the thickness of the wiring substrate 1 is as small as about 50~about 200 μm, the highly elastic member 5 around the semiconductor chip 2 can keep the flatness of the wiring substrate 1.

Further, since the highly elastic member 5 is made of a synthetic resin material, the highly elastic member 5 can be formed, in a molding process, in a unitary structure with the wiring substrate 1. Accordingly, as compared with a semiconductor device made by applying adhesives to a metallic stiffener and then bonding the same to the wiring substrate, the semiconductor device of the present invention can be simplified in production process, resulting in improved productivity.

The highly elastic member 5 may be formed before the metallic heat radiating plate 6 is glued to the semiconductor chip 2, or may be formed by pouring a liquefied thermosetting resin material into the gap between the wiring substrate 1 and the metallic heat radiating plate 6 after the metallic heat radiating plate 6 has been glued to the semiconductor chip 2.

In FIG. 1, there is a gap between the semiconductor chip 2 and the highly elastic member 5. However, the semiconductor chip 2 may come in contact with the highly elastic member 5 such that no gap is formed therebetween.

In the foregoing, an embodiment of the present invention has been discussed, but the present invention should not be limited to this embodiment. For example, in the embodiment above-mentioned, the thermosetting resin has been discussed as the material of the highly elastic member 5, but for example a thermoplastic resin may also be used as the material of the highly elastic member 5.

In the embodiment above-mentioned, there has been discussed a semiconductor device in which one semiconductor chip 2 is bonded to the surface 11 of the wiring substrate 1. However, the present invention can also be applied to a semiconductor device in which a plurality of semiconductor chips are bonded to the surface 11 of the wiring substrate 1.

In the embodiment above-mentioned, the electric connection between the wiring substrate 1 and the semiconductor chip 2 is achieved through the bumps 3. However, the electric connection between the wiring substrate 1 and the semiconductor chip 2 may also be achieved through bonding wires.

Further, in the embodiment above-mentioned, the soldering balls 4 serving as the external connection terminals, are formed on the reverse face 12 of the wiring substrate 1. However, there may be formed ball-like terminals made of other conductive material than solder. Further, the external connection terminals may be pin-like lead terminals, instead of the ball-like terminals.

Embodiments of the present invention have been discussed in detail, but these embodiments are mere specific examples for clarifying the technical contents of the present invention. Therefore, the present invention should not be construed as limited to these specific examples. The spirit and scope of the present invention are limited only by the appended claims.

This Application corresponds to Japanese Patent Application Serial No. 2001-68798 filed on Mar. 12, 2001 with Japanese Patent Office, the disclosure of which is incorporated herein by reference.

What I claim is:

1. A semiconductor device comprising:

a wiring substrate having a wiring pattern;

a semiconductor chip disposed on the wiring substrate and electrically connected to the wiring pattern;

a heat radiating plate disposed at a side of the semiconductor chip which is opposite to a side thereof facing the wiring substrate, the heat radiating plate being arranged for radiating heat generated from the semiconductor chip; and a highly elastic member of a synthetic resin so disposed as to surround the semiconductor chip between the wiring substrate and the heat radiating plate wherein the highly elastic member is formed as a unitary structure with the wiring substrate.

2. A semiconductor device according to claim 1, wherein the highly elastic member is higher in elasticity than the wiring substrate.

3. A semiconductor device according to claim 1, wherein the highly elastic member is stuck fast to the heat radiating plate.

4. A semiconductor device according to claim 1, wherein the wiring substrate and the heat radiating plate are substantially equal to each other in size in plan.

* * * * *